US009124290B2

(12) United States Patent
Sherry et al.

(10) Patent No.: US 9,124,290 B2
(45) Date of Patent: Sep. 1, 2015

(54) METHOD AND APPARATUS FOR SEPARATING THE REFERENCE CURRENT FROM THE INPUT SIGNAL IN SIGMA-DELTA CONVERTER

(71) Applicants: Adrian W. Sherry, Raheen (IE); Gabriel Banarie, Murroe (IE); Roberto S. Maurino, Turin (IT)

(72) Inventors: Adrian W. Sherry, Raheen (IE); Gabriel Banarie, Murroe (IE); Roberto S. Maurino, Turin (IT)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 13/757,455

(22) Filed: Feb. 1, 2013

(65) Prior Publication Data

US 2013/0207821 A1    Aug. 15, 2013

Related U.S. Application Data

(60) Provisional application No. 61/597,342, filed on Feb. 10, 2012.

(51) Int. Cl.
*H03M 3/00*    (2006.01)
*G06G 7/184*    (2006.01)

(52) U.S. Cl.
CPC .................. *H03M 3/30* (2013.01); *G06G 7/184* (2013.01); *H03M 3/322* (2013.01); *H03M 3/358* (2013.01); *H03M 3/458* (2013.01); *H03M 3/496* (2013.01)

(58) Field of Classification Search
CPC ...................................... H03M 3/342
USPC .......................... 341/143, 155, 172
See application file for complete search history.

(56) References Cited

U.S. PATENT DOCUMENTS

| 4,999,627 | A | * | 3/1991 | Agazzi | 341/131 |
| 5,323,158 | A | * | 6/1994 | Ferguson, Jr. | 341/143 |
| 5,541,599 | A | | 7/1996 | Kasha et al. | |
| 7,068,198 | B2 | * | 6/2006 | Hong et al. | 341/143 |
| 7,489,263 | B1 | | 2/2009 | Drakshapalli et al. | |

FOREIGN PATENT DOCUMENTS

WO    2011/008928    1/2011

OTHER PUBLICATIONS

Analog Devices, Inc., "3 V / 5 V, CMOS 500 mu—A Signal Conditioning ADC," AD7714 Datasheet, Rev. C, 1998.
International Search Report and Written Opinion of the International Searching Authority in counterpart international application No. PCT/IB2013/000726, report dated Oct. 25, 2013.

* cited by examiner

*Primary Examiner* — Jean B Jeanglaude
(74) *Attorney, Agent, or Firm* — Kenyon & Kenyon LLP

(57) ABSTRACT

An integrator system may have a pair of sampling circuits each having a sampling capacitor to sample a respective component of a differential input signal, and an integrator having inputs coupled to outputs of the sampling circuits. The system may have a shorting switch coupled between input terminals of the sampling capacitors. The shorting switch may be engaged during an interstitial phase between sampling and output phases of the sampling circuits. By shorting input terminals of the sampling capacitors together, the design reduces current drawn by the system and, in some designs, severs relationships between current draw and information content sampled by the system. The integrator system may receive analog and digital input signals.

26 Claims, 8 Drawing Sheets

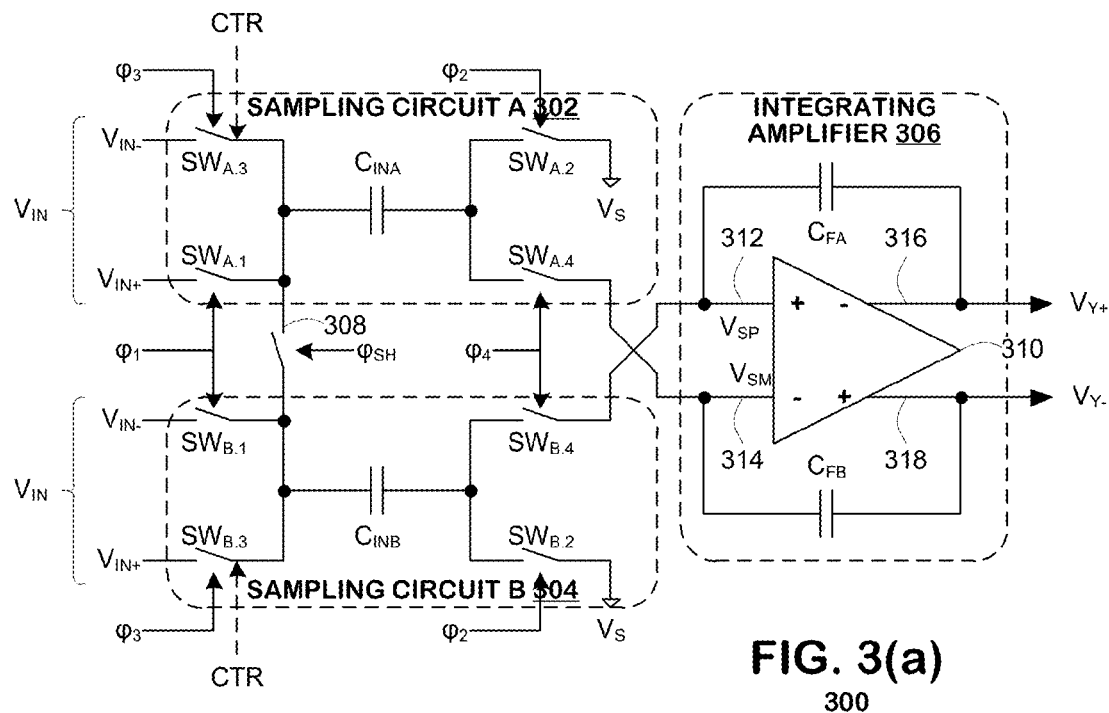
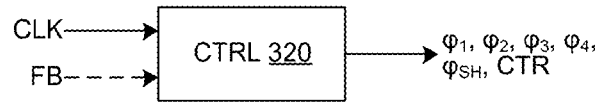
FIG. 3(a)
300
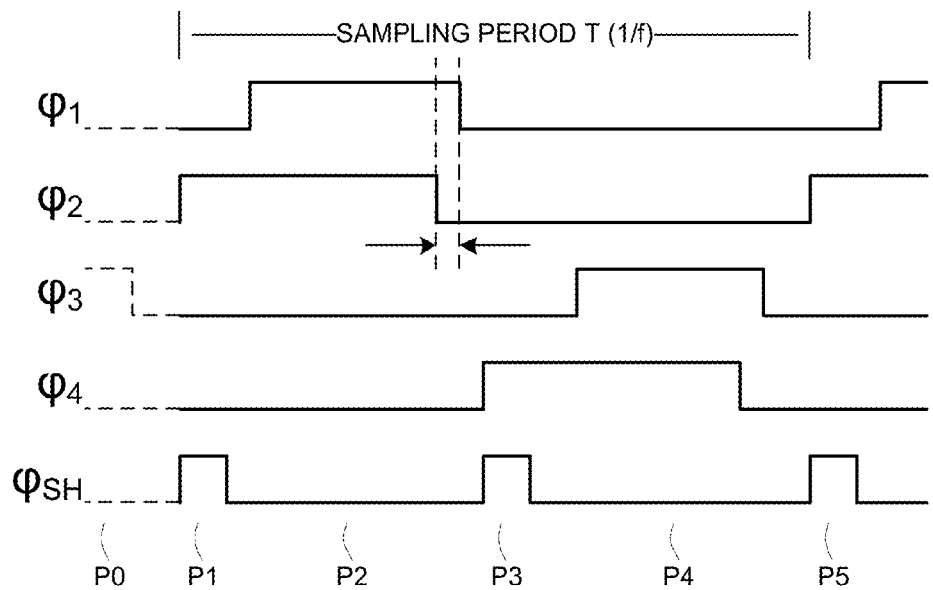
FIG. 3(b)

400

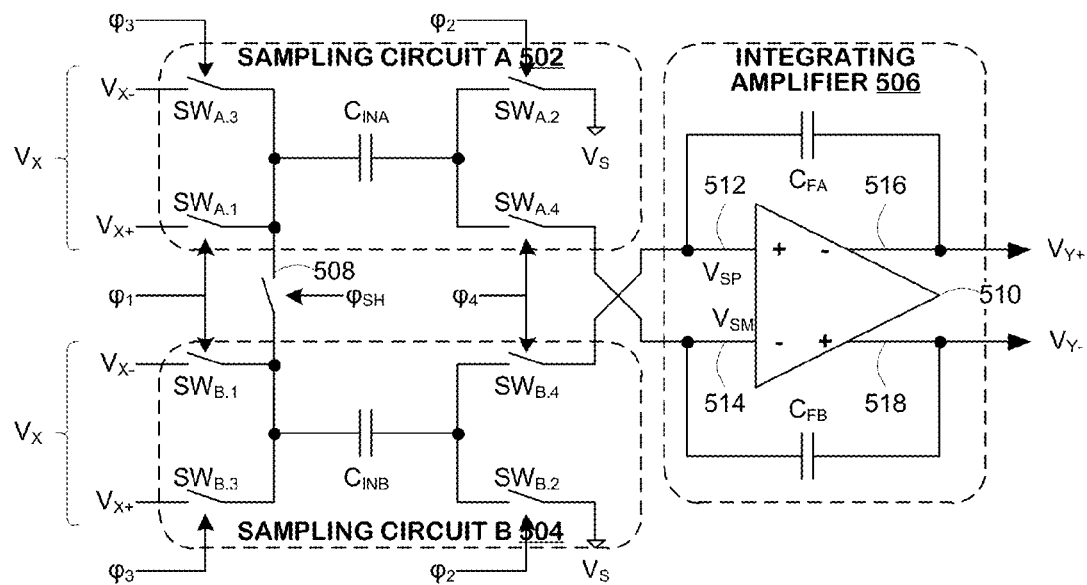
FIG. 5(a)
500
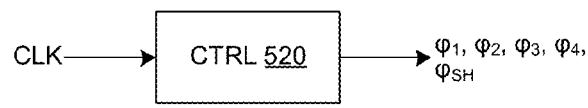
FIG. 5(b)
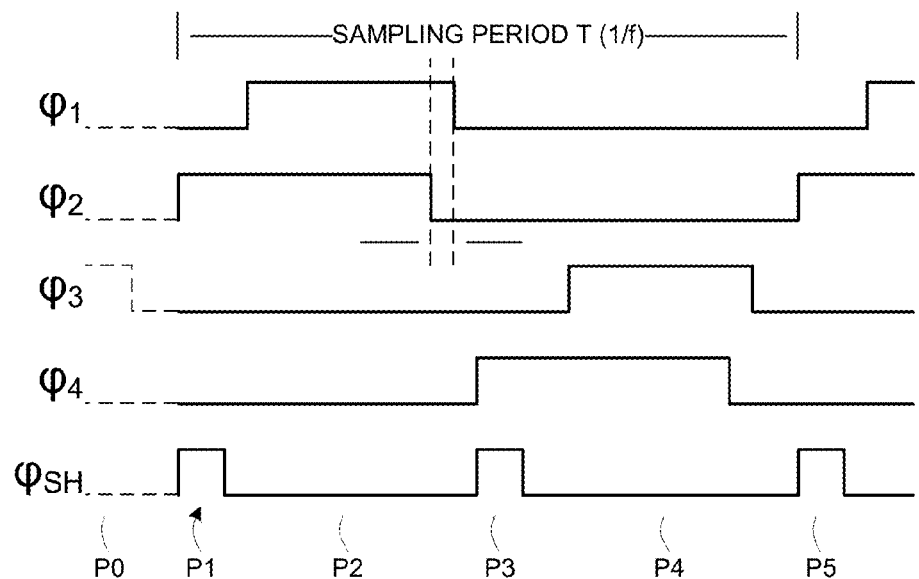

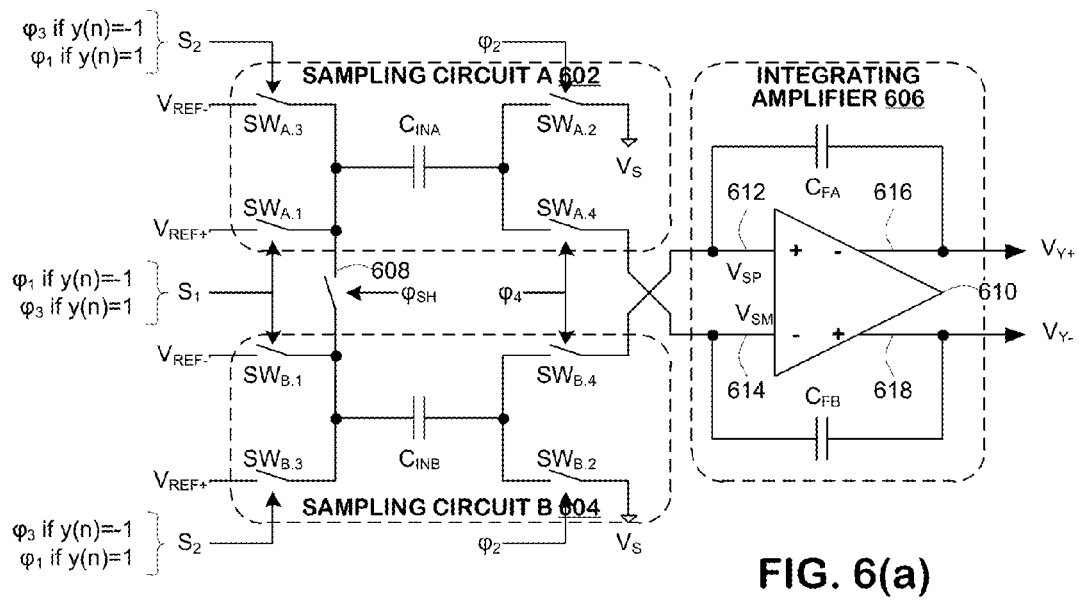
FIG. 6(a)
600
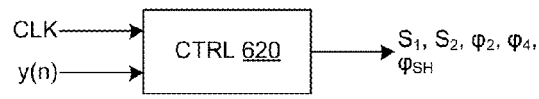
FIG. 6(b)
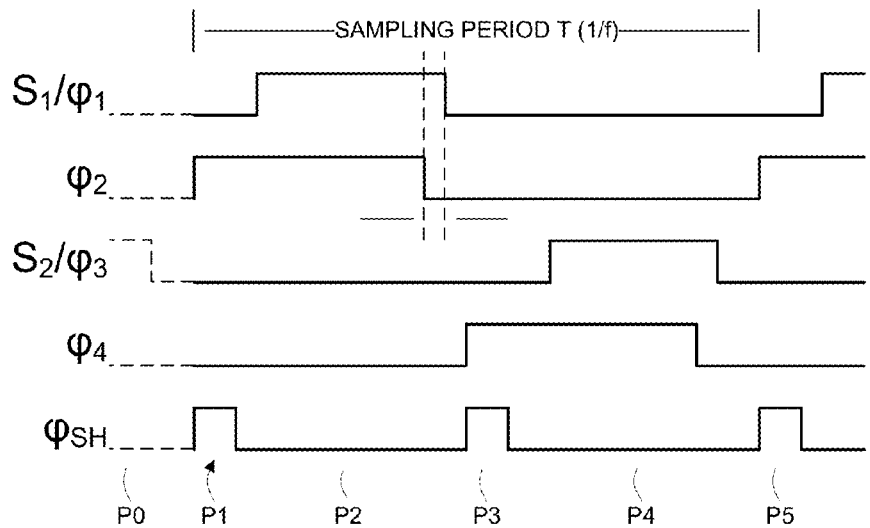

$\varphi_1$ if $y_i(n)=-1$ 
$\varphi_3$ if $y_i(n)=1$ } $S_{1,i}$ $\varphi_3$ if $y_i(n)=-1$ 
$\varphi_1$ if $y_i(n)=1$ } $S_{2,i}$

900

METHOD AND APPARATUS FOR SEPARATING THE REFERENCE CURRENT FROM THE INPUT SIGNAL IN SIGMA-DELTA CONVERTER

CROSS-REFERENCE TO RELATED APPLICATIONS

The present invention benefits from priority afforded by U.S. patent application Ser. No. 61/597,342, entitled "Method and Apparatus for Separating the Reference Current from the Input Signal in Sigma-Delta Converter," filed Feb. 10, 2012, the disclosure of which is incorporated herein in its entirety.

BACKGROUND

The present invention relates to sigma delta (ΣΔ) converters.

In conventional ΣΔ converters, a front-end stage samples an input voltage with charge storage components (i.e., storage capacitors), and the charge is then accumulated on another set of components (i.e., integrating capacitors). The integrated samples are then quantized by an analog-to-digital converter (ADC), for example, a flash ADC. The ADC output is also looped back via a feedback DAC to be subtracted from the input voltage. The feedback DAC samples a reference voltage dependent on the ADC output bit state(s).

FIG. 1 illustrates a conventional single phase switched capacitor integrator that can be provided in a ΣΔ front-end stage with an associated operation timing diagram. In FIG. 1, the input voltage $V_x$ (or $-V_x$ depending on input capacitor polarity), where $V_x = V_{x+} - V_{x-}$, is sampled onto input capacitors $C_{ina}$ and $C_{inb}$ based on timing signals $\phi_1$ and $\phi_2$. The left hand side (LHS) switches are controlled by timing signals $\phi_1$ and $\phi_2$, while the right hand side (RHS) switches are controlled by $\phi_{1r}$ and $\phi_{2r}$. The two sets of timing signals generally have the same phase relationship; however, the rising and falling edges may be slightly different to minimize undesirable effects, such as charge injection. The details of the slight differences are not described here. The above circuit is sampled at frequency $f_s$, and $V_s$ is a supply voltage. The timing signals $\phi_1$ and $\phi_2$ alternate and, hence, their respective rising and falling edges are substantially synchronized. Thus, the average current drawn from nodes $V_{x+}$ and $V_{x-}$ occurs as follows:

$$\overline{I_{V_{x+}}} = -\overline{I_{V_{x-}}} = 2V_x f_s C_{in}, \qquad \text{Eq. 1}$$

where $C_{in} = C_{ina} = C_{inb}$. The average current drawn varies based on the content of the input signal because the average current will flow from the node with higher potential into the node with lower potential and is not altered by the amount charge transferred to the output of the circuit. Simply stated, the average current drawn is a function of $V_x$, $f_s$, and $C_{in}$.

FIG. 2 illustrates a conventional single phase-switched capacitor integrator that can be provided in a ΣΔ feedback DAC with an associated operation timing diagram. In FIG. 2, a reference voltage $V_{ref}$, where $V_{ref} = V_{ref+} - V_{ref-}$, is sampled onto input capacitors $C_{refa}$ and $C_{refb}$ based on timing signals $\phi_1$ and $\phi_2$, which are modulated by an information signal (y(n)). The LHS switches have control inputs coupled to timing signals $\phi_1$ and $\phi_2$, while the RHS switches are controlled by $\phi_{1r}$ and $\phi_{2r}$. The two sets of timing signals generally have the same phase relationship as illustrated; however, the rising and falling edges may be slightly different to minimize undesirable effects such as charge injection. The details of the slight differences are not described here. The above circuit is sampled at frequency $f_s$. The timing signals $\phi_1$ and $\phi_2$ alternate and, hence, their respective rising and falling edges are substantially synchronized. Also, the LHS switches are controlled by the state of a previous output stage y(n). Thus, the average current drawn by the circuit can be expressed as:

$$\overline{I_{Vref+}} = -\overline{I_{Vref-}} = 2V_{ref} f_s C_{ref} - \frac{1}{2} V_{ref} f_s C_{ref} |y(n) - y(n-1)| \qquad \text{Eq. 2}$$

Here, the LHS feedback introduces a dependency between the current drawn from the reference voltage and a state of a previous output stage y(n). Hence, any series impedance on the reference nodes can cause non-linear modulation of the effective reference voltage, inducing tonal behavior, which distorts the output signal.

Accordingly, the inventors perceive a need in the art for ΣΔ structure having input circuits that conserve current consumption, whose current draw is not dependent on variation in input signal and that delivers outputs with greater accuracy than prior systems.

BRIEF DESCRIPTION OF THE DRAWINGS

FIGS. 3(a) and 3(b) illustrate an integrator system and control signals according to an embodiment of the present invention.

FIGS. 5(a) and 5(b) illustrate an integrator system and control signals according to another embodiment of the present invention.

FIGS. 6(a) and 6(b) illustrate an integrator system and control signals according to a further embodiment of the present invention.

DETAILED DESCRIPTION

Figure 1A:
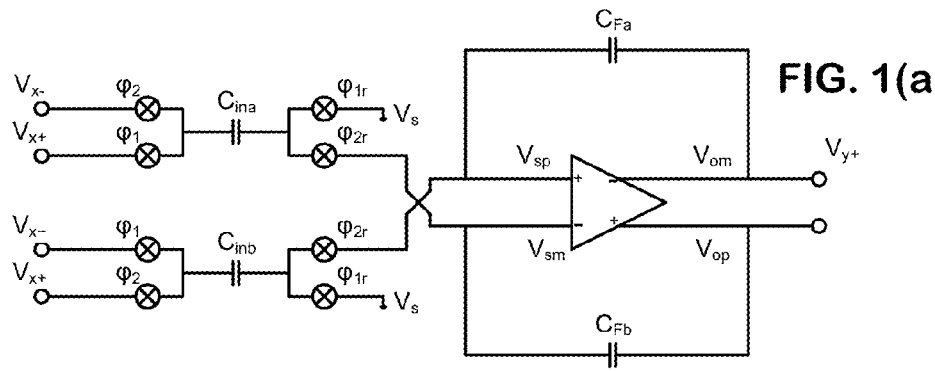
FIGS. 1(a), 1(b), 2(a), and 2(b) illustrate known integrator systems and their respective timing signals.

Embodiments of the present invention provide an integrator system having a pair of sampling circuits each having a sampling capacitor to sample a respective component of a differential input signal, and an integrator having inputs coupled to outputs of the sampling circuits. The system may have a shorting switch coupled between input terminals of the sampling capacitors. The shorting switch may be engaged during interstitial phases between sampling and output phases of the sampling circuits. By shorting input terminals of the sampling capacitors together, the design reduces current drawn by the system and, in some designs, severs relationships between current draw and information content sampled by the system.

FIG. 3 illustrates an integrator system 300 according to an embodiment of the present invention. As illustrated in FIG. 3(a), the integrator system 300 may include a pair of sampling circuits 302, 304, an integrating amplifier 306 and a shorting switch 308. The system 300 may accept an input signal $V_{IN}$ that is represented within the integrator system 300 as a pair of inputs $V_{IN+}$, $V_{IN-}$ that vary differentially with respect to each other. The sampling circuits 302, 304, may sample respective components $V_{IN+}$, $V_{IN-}$ of the input signal $V_{IN}$ and present it to the integrating amplifier 306. The integrating amplifier 306, as its name implies, may integrate the sampled input signal and generate an output signal $V_Y$ therefrom.

The sampling circuits 302, 304 each may include a sampling capacitor, $C_{INA}$, $C_{INB}$ and a variety of switches $SW_{A.1}$-$SW_{A.4}$, $SW_{B.1}$-$SW_{B.4}$. A first terminal of each sampling capacitor $C_{INA}$, $C_{INB}$ (called an "input terminal," for convenience) may be connected to the $V_{IN+}$ terminals by a respective first switch $SW_{A.1}$, $SW_{B.3}$. The input terminal of each sampling capacitors $C_{INA}$, $C_{INB}$ also may be connected to the $V_{IN-}$terminals by a respective second switch $SW_{A.3}$, $SW_{B.1}$. A second terminal of each sampling capacitor $C_{INA}$, $C_{INB}$ (called an "output terminal," for convenience) may be connected to a reference voltage $V_S$ by a respective third switch $SW_{A.2}$, $SW_{B.2}$. The $V_S$ voltage may be a virtual ground for the integrating amplifier 306. The output terminal of each sampling capacitor $C_{INA}$, $C_{INB}$ may be connected to the integrating amplifier 306 by a respective fourth switch $SW_{A.4}$, $SW_{B.4}$. The switches $SW_{A.1}$ and $SW_{B.1}$ may be controlled by a first control signal $\phi_1$, switches $SW_{A.2}$ and $SW_{B.2}$ may be controlled by a second control signal $\phi_2$, switches $SW_{A.3}$ and $SW_{B.3}$ may be controlled by a third control signal $\phi_3$ and switches $SW_{A.4}$ and $SW_{B.4}$ may be controlled by a fourth control signal $\phi_4$.

A shorting switch 308 may connect the input terminals of the sampling capacitors $C_{INA}$, $C_{INB}$ to each other. The shorting switch 308 may be controlled by another control signal $\phi_{SH}$.

The integrating amplifier 306 may include a differential amplifier 310 and a pair of feedback capacitors $C_{FA}$, $C_{FB}$. The first feedback capacitor $C_{FA}$ may be coupled between a non-inverting input 312 and an inverting output 316 of the amplifier 310. The second feedback capacitor $C_{FB}$ may be coupled between an inverting input 314 and a non-inverting output 318 of the amplifier 310. The non-inverting input 312 may be connected to an output of sampling circuit 304 (switch $SW_{B.4}$) and the inverting input 314 may be connected to an output of sampling circuit 302 (switch $SW_{A.4}$).

FIG. 3(b) illustrates control signals that may be applied to the integrator system 300 according to an embodiment of the present invention. FIG. 3(b) illustrates four phases of operation P1-P4 that may repeat throughout operation of the integrator system 300. Two phases P2 and P4 may be operational phases during which the sampling circuits 302 and 304 may be connected to an input signal $V_{IN}$ to alternately sample the input signal $V_{IN}$ (phase P2) and drive the sampled signal to the integrating amplifier 306 (phase P4). Two other phases P1 and P3 may be reset phases during which input terminals of the sampling capacitors $C_{INA}$, $C_{INB}$ may be set to voltages at intermediate levels between $V_{IN+}$ and $V_{IN-}$ through charge redistribution.

In a first phase P1, the $\phi_1$, $\phi_3$ and $\phi_4$ signals are shown as low and the $\phi_2$ and $\phi_{SH}$ signals are shown as high. Thus, switches $SW_{A.2}$, $SW_{B.2}$ and 308 may be closed and switches $SW_{A.1}$, $SW_{A.3}$-$SW_{A.4}$ and $SW_{B.1}$, $SW_{B.3}$-$SW_{B.4}$ all may be open. Closure of the shorting switch 308 may cause charge sharing between first terminals of the sampling capacitors $C_{INA}$, $C_{INB}$, which may move the voltage at the first terminals to a common mode value ($V_{CM}$) of the input signals $V_{IN+}$, $V_{IN-}$, which was developed in a prior phase of operation (shown as P0). No current is drawn from the $V_{IN+}$ and $V_{IN-}$ inputs. Closure of the switches $SW_{A.2}$, $SW_{B.2}$ may connect output terminals of the capacitors $C_{INA}$, $C_{INB}$ to the $V_S$ reference voltage. Thus, during phase P1, the capacitors each may sample a voltage of $V_{CM}$-$V_S$, where $V_{CM}$=½($V_{IN+}$+$V_{IN-}$).

In a second phase P2, the $\phi_{SH}$ signal may transition low and the $\phi_1$ signal may transition high. The other control signals $\phi_2$, $\phi_3$ and $\phi_4$ may remain unchanged from phase P1. Thus, switches $SW_{A.1}$, $SW_{B.1}$ may connect input terminals of the sampling capacitors $C_{INA}$, $C_{INB}$ to $V_{IN+}$ and $V_{IN-}$, respectively. Switches $SW_{A.2}$ and $SW_{B.2}$ may remain closed. The sampling capacitor $C_{INA}$ may sample a voltage as $V_{IN+}$-$V_S$ and the sampling capacitor $C_{INB}$ may sample a voltage as $V_{IN-}$-$V_S$. Switches $SW_{A.3}$, $SW_{A.4}$, $SW_{B.3}$, $SW_{B.4}$ and 308 all may be open. The $\phi_1$ and $\phi_2$ signals may transition low on conclusion of the second phase P2.

In a third phase P3, the $\phi_1$, $\phi_2$ and $\phi_3$ signals are shown as low and the $\phi_4$ and $\phi_{SH}$ signals are shown as high. Thus, switches $SW_{A.4}$, $SW_{B.4}$ and 308 may be closed and switches $SW_{A.1}$-$SW_{A.3}$ and $SW_{B.1}$-$SW_{B.3}$ all may be open. Closure of the shorting switch 308 may cause charge sharing between first terminals of the sampling capacitors $C_{INA}$, $C_{INB}$, which may move the voltage at the first terminals to a common mode value ($V_{CM}$) of the input signals $V_{IN+}$, $V_{IN-}$, which was developed in phase P2. No current is drawn from the $V_{IN+}$ and $V_{IN-}$ inputs. Closure of the switches $SW_{A.4}$, $SW_{B.4}$ may connect output terminals of the sampling capacitors $C_{INA}$, $C_{INB}$ to the integrating amplifier 306.

In a fourth phase P4, the $\phi_{SH}$ signal may transition low and the $\phi_3$ signal may transition high. The other control signals $\phi_1$, $\phi_2$ and $\phi_4$ may remain unchanged from phase P3. Thus, switches $SW_{A.3}$, $SW_{B.3}$, $SW_{A.4}$ and $SW_{B.4}$ may be closed and switches $SW_{A.1}$, $SW_{A.2}$, $SW_{B.1}$ and $SW_{B.2}$ and 308 all may be open. In phase P4, the input terminal of sampling capacitor $C_{INA}$ may be connected to the $V_{IN-}$ terminal by switch $SW_{A.3}$ and the input terminal of sampling capacitor $C_{INB}$ may be connected to the $V_{IN+}$ terminal by the switch $SW_{B.3}$. These connections may force a change in voltage at the outputs $V_{Y+}$, $V_{Y-}$ of the integrating amplifier 306 that corresponds to the difference between $V_{IN+}$ and $V_{IN-}$.

Operation of phases P1-P4 may repeat throughout operation of the integrator system 300. Thus, phase P5 is shown as a subsequent iteration of phase P1 and phase P0 is shown as a prior iteration of phase P4. $V_{IN+}$ and $V_{IN-}$ may be time-varying signals and, therefore, the change in output voltage ($V_{Y+}$-$V_{Y-}$) also may vary in these iterations.

In an embodiment, the integrator system 300 may include a controller 320 that generates the $\phi_1$, $\phi_2$, $\phi_3$, $\phi_4$ and $\phi_{SH}$, control signals in response to an input clock signal CLK that establishes timing reference for the integrator system 300. The controller 320 may be a state machine that is driven by the input clock CLK. In an embodiment, the controller 320 may include a register (not shown) that defines a sampling period for the integrator system 300 and, consequently, its sampling frequency. The register may allow the sampling frequency to be a dynamically programmable value.

As indicated, input terminals of the sampling capacitors $C_{INA}$, $C_{INB}$ in the sampling circuits 302, 304 may be shorted at each phase P1 and P3. The input terminals of the sampling capacitors $C_{INA}$, $C_{INB}$, therefore, may charge to an intermediate level of the input signal $V_{IN}$, specifically its common mode value. In an embodiment, when $C_{FA}$=$C_{FB}$=$C_F$, $C_{INA}$=$C_{INB}$=$C_{IN}$, the average current drawn from nodes $V_{IN+}$ and $V_{IN-}$ may be expressed as:

$$\overline{I_{V_{IN+}}} = -\overline{I_{V_{IN-}}} = V_{IN} f_s C_{in}. \quad \text{Eq. 3}$$

Figure 1:
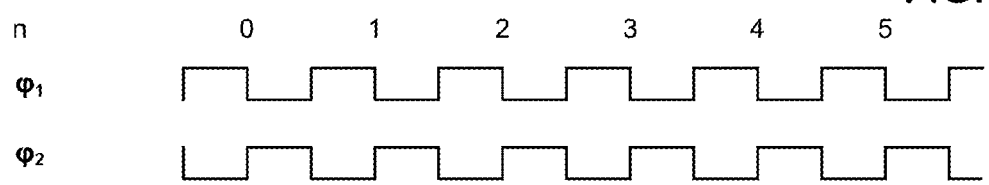
Figure 2A:
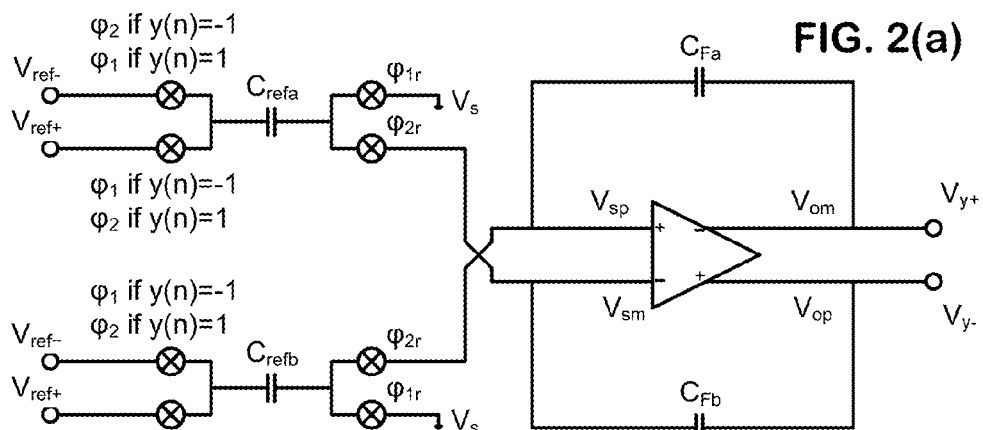
Figure 2B:
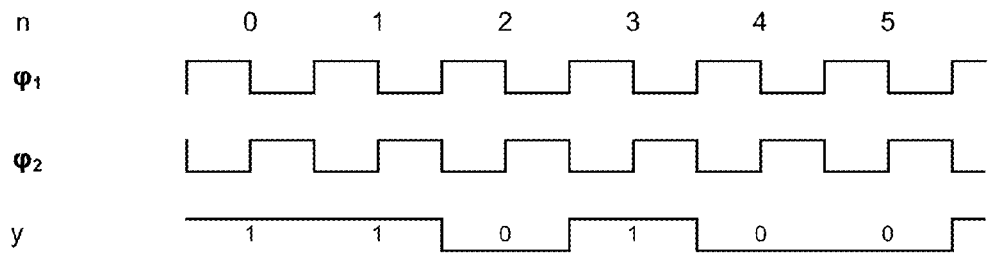

As compared to the current draw of the FIG. 1 configuration (Eq. 1), the integrator system 300 of FIG. 3(a) conserves current by a factor of two (Eq. 3).

In an embodiment, a falling transition of the $\phi_2$ signal may precede a falling transition of the $\phi_1$ signal in the P2 phase to mitigate against charge injection errors that otherwise might occur. Similarly, a falling transition of the $\phi_4$ signal may precede a falling transition of the $\phi_3$ signal in the P4 phase, again to mitigate against charge injection errors that otherwise might occur.

In another embodiment, the sampling circuits 302, 304 may operate under influence of a control signal (CTR). For example in a feedback component embodiment of a ΣΔ converter, a control signal CTR may also be provided to dynamically adjust switch states. Thus, control signals to the input switches $SW_{A.1}$, $SW_{A.3}$, $SW_{B.1}$ and $SW_{B.3}$ of the sampling circuits 302, 304 may be generated from a logical combination of the CTR signal and the respective $\phi_1$ or $\phi_3$ signal and may be switched per phase. The CTR signal may be a feedback control signal provided in a feedback path of a converter. For example, if the integrator system 300 is implemented in a feedback DAC embodiment, the CTR signal may correspond to the ΣΔ converter output bit state (y(n)). The controller 320 may perform a logical combination of a feedback signal FB and the $\phi_1$, $\phi_3$ signals to generate the CTR signal. In such embodiments, discussed hereinbelow, the average current draw of the circuit may be independent of information content of the CTR signal.

The embodiment of FIG. 3 illustrates switch control signals that are "active high," that is, the switches $SW_{A.1}$-$SW_{A.4}$, $SW_{B.1}$-$SW_{B.4}$ and 308 all are shown as closing when their associated control signals transition from a low voltage to a high voltage. In such an embodiment, the switches $SW_{A.1}$-$SW_{A.4}$, $SW_{B.1}$-$SW_{B.4}$ and 308 may be provided as NMOS transistors. In an alternate embodiment, the switch control signals may be provided as "active low" signals, which would cause the switches $SW_{A.1}$-$SW_{A.4}$, $SW_{B.1}$-$SW_{B.4}$ and 308 to close when their associated control signals transition from a high voltage to a low voltage. In such an embodiment, the switches $SW_{A.1}$-$SW_{A.4}$, $SW_{B.1}$-$SW_{B.4}$ and 308 may be provided as PMOS transistors. In another embodiment, each switch may be provided as a pair of transistors, an NMOS transistor and a PMOS transistor, having their sources and drains coupled together. In this latter embodiment, each control signal $\phi_1$, $\phi_2$, $\phi_3$, $\phi_4$ may be provided as a pair of control signals, one as an active high signal for the NMOS switch and another as an active low signal for the PMOS switch.

Figure 4:
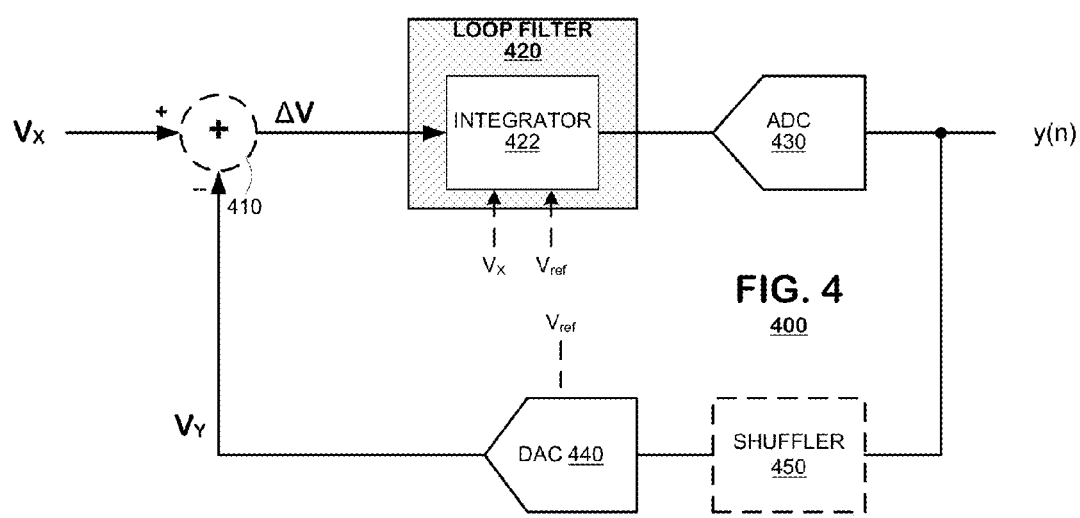
FIG. 4 is a simplified block diagram of a converter according to an embodiment of the present invention.

FIG. 4 is a functional block diagram of a ΣΔ modulator 400 according to an embodiment of the present invention. The modulator 400 may generate a digital output signal y(n) from an analog input voltage, shown as $V_X$. The modulator 400 may include a subtractor 410, a loop filter 420, an analog to digital converter 430 and a digital to analog converter (DAC) 440 provided in feedback. The subtractor 410 may have inputs for the input voltage $V_X$ and for a feedback signal, which is an analog representation of the output signal $V_Y$. The subtractor 410 may output an analog signal $\Delta V$ representing a difference between these two inputs ($\Delta V = V_X - V_Y$), which may be input to the loop filter 420. The loop filter circuit 420 may sample the voltage presented to it and hold it for digitization by the ADC 430. In an embodiment, the loop filter 420 may include an integrator 422 as described in FIG. 3, 5 or 8. The ADC 430 may output a digitized representation of the voltage presented by the integrator 422, which may be output from the modulator 400 as the output value y(n). In one implementation, the ADC 430 may be a flash ADC.

The DAC 440 may be provided in a feedback path of the modulator 400. The DAC 440 may generate an analog voltage from the output value y(n). Various DAC circuit embodiments are described below in FIGS. 6 and 7.

Optionally, the modulator 400 may include a shuffler 450 in the feedback path that randomizes use of components within the DAC 440 to generate the analog feedback voltage $V_Y$. That is, the DAC 440 may include a variety of elements (not shown) that, in ideal circumstances, would contribute equally to the analog feedback voltage $V_Y$ but, due to manufacturing errors, may have relative offset errors. If the modulator 400 generates common output values at different times (e.g., y(i)=y(j) for i≠j), the shuffler 450 may select different combinations of the equal-contribution elements so as to frequency shape error values in the feedback voltage $V_Y$.

As indicated, FIG. 4 is a functional block diagram of a ΣΔ modulator 400. When the a ΣΔ modulator 400 is manufactured in an integrated circuit, the circuit need not possess discrete circuit elements representing the subtractor, loop filter 420 and DAC 440. For example, the subtractor 410 may be performed by charge transfer elements that are provided within circuit components of the integrator 422. The subtractor may induce a charge transfer ($\Delta Q$) whose value is proportional to a difference between the input voltage $V_X$ and the analog feedback voltage $V_Y$.

The loop filter 420 may perform other operations typical for ΣΔ converters 400, such as filtering to produce characteristic noise shaping of a sigma-delta modulator. In this regard, the loop filter 420 may include one or more integrator stages, depending on design requirements. In an embodiment, the loop filter 420 may include an integrator 422 as described in FIG. 3, 5 or 8. Other design considerations of loop filters are immaterial to the present discussion and, therefore, are omitted.

As can be observed in FIG. 3(b), given a fixed sampling frequency, the introduction of a reset phases P1 and P3 ($\phi_{SH}$) into operation of an integrator reduces an amount of time that can be devoted to operational phases P2 and P4. However, in multi-bit implementations with the employ of a feedback DAC 440 and shuffler 450, the reset phases P1 and P3 ($\phi_{SH}$) may be designed to coincide with the shuffler 450 propagation time. In this manner, the reset phases P1 and P3 ($\phi_{SH}$) may be introduced to a modulator 400 without adding additional constraints on the system or otherwise lowering its throughput.

FIG. 5 illustrates an integrator system 500 and control signals according to another embodiment of the present invention. As illustrated in FIG. 5(a), the integrator system 500 may include a pair of sampling circuits 502, 504, an integrating amplifier 506 and a shorting switch 508. The integrator system 500 may accept the input signal $V_X$ as a pair of differential inputs $V_{X+}$, $V_{X-}$ that vary about a common mode voltage $V_{CM}$ (not shown). The sampling circuits 502, 504, may sample respective components $V_{X+}$, $V_{X-}$ of the input signal $V_X$ and present it to the integrating amplifier 506. The integrating amplifier 506, as its name implies, may integrate the sampled input signal $V_X$ and generate an output signal $V_Y$ therefrom.

The sampling circuits 502, 504 each may include a sampling capacitor $C_{INA}$, $C_{INB}$ and a variety of switches $SW_{A.1}$-$SW_{A.4}$, $SW_{B.1}$-$SW_{B.4}$. A first terminal of each sampling capacitor $C_{INA}$, $C_{INB}$ (again, "input terminal") may be connected to the $V_{X+}$ terminals by a respective switch $SW_{A.1}$, $SW_{B.3}$. The input terminal of each sampling capacitors $C_{INA}$, $C_{INB}$ also may be connected to the $V_{X-}$ terminals by a respective second switch $SW_{A.3}$, $SW_{B.1}$. A second terminal of each sampling capacitor $C_{INA}$, $C_{INB}$ ("output terminal") may be connected to a reference voltage $V_S$ by a respective third switch $SW_{A.2}$, $SW_{B.2}$. The output terminal of each sampling capacitor $C_{INA}$, $C_{INB}$ may be connected to the integrating amplifier 506 by a respective fourth switch $SW_{A.4}$, $SW_{B.4}$. The switches $SW_{A.1}$ and $SW_{B.1}$ may be controlled by a first control signal $\phi_1$, switches $SW_{A.2}$ and $SW_{B.2}$ may be controlled by a second control signal $\phi_2$, switches $SW_{A.3}$ and $SW_{B.3}$ may be controlled by a third control signal $\phi_3$ and switches $SW_{A.4}$ and $SW_{B.4}$ may be controlled by a fourth control signal $\phi_4$.

A shorting switch 508 may connect the input terminals of the sampling capacitors $C_{INA}$, $C_{INB}$ to each other. The shorting switch 508 may be controlled by another control signal $\phi_{SH}$.

The integrating amplifier 506 may include a differential amplifier 510 and a pair of feedback capacitors $C_{FA}$, $C_{FB}$. The first feedback capacitor $C_{FA}$ may be coupled between a non-inverting input 512 and an inverting output 516 of the amplifier 510. The second feedback capacitor $C_{FB}$ may be coupled between an inverting input 514 and a non-inverting output 518 of the amplifier 510. The non-inverting input 512 may be connected to an output of sampling circuit 504 (switch $SW_{B.4}$) and the inverting input 514 may be connected to an output of sampling circuit 502 (switch $SW_{A.4}$).

FIG. 5(b) illustrates control signals that may be applied to the integrator system 500 according to an embodiment of the present invention. FIG. 5(b) illustrates four phases of operation P1-P4 that may repeat throughout operation of the integrator system 500. Two phases P2 and P4 may be operational phases during which the sampling circuits 502 and 504 may be connected to an input signal $V_X$ to alternately sample the input signal and drive the input signal to the integrating amplifier 506. Two other phases P1 and P3 may be reset phases during which the input terminals of the sampling capacitors $C_{INA}$, $C_{INB}$ may be set to voltages at intermediate levels between $V_{X+}$ and $V_{X-}$ through charge redistribution.

In a first phase P1, the $\phi_1$, $\phi_3$ and $\phi_4$ signals are shown as low and the $\phi_2$ and $\phi_{SH}$ signals are shown as high. Thus, switches $SW_{A.2}$, $SW_{B.2}$ and 508 may be closed and switches $SW_{A.1}$, $SW_{A.3}$-$SW_{A.4}$ and $SW_{B.1}$, $SW_{B.3}$-$SW_{B.4}$ all may be open. Closure of the shorting switch 508 may cause charge sharing between first terminals of the sampling capacitors $C_{INA}$, $C_{INB}$, which may move the voltage at the first terminals to a common mode value ($V_{CM}$) of the input signals $V_{X+}$, $V_{X-}$, which was developed in a prior phase of operation (shown as P0). No current is drawn from the $V_{X+}$ and $V_{X-}$ inputs. Closure of the switches $SW_{A.2}$, $SW_{B.2}$ may connect output terminals of the capacitors $C_{INA}$, $C_{INB}$ to the $V_S$ reference voltage. Thus, during phase P1, the capacitors each may sample a voltage of $V_{CM}-V_S$, where $V_{CM}=\frac{1}{2}(V_{X+}+V_{X-})$.

In a second phase P2, the $\phi_{SH}$ signal may transition low and the $\phi_1$ signal may transition high. The other control signals $\phi_2$, $\phi_3$ and $\phi_4$ may remain unchanged from phase P1. Thus, switches $SW_{A.1}$, $SW_{B.1}$ may connect input terminals of the sampling capacitors $C_{INA}$, $C_{INB}$ to $V_{X+}$ and $V_{X-}$ respectively. Switches $SW_{A.2}$ and $SW_{B.2}$ may remain closed. The sampling capacitor $C_{INA}$ may sample a voltage as $V_{X+}-V_S$ and the sampling capacitor $C_{INB}$ may sample a voltage as $V_{X-}-V_S$. Switches $SW_{A.3}$, $SW_{A.4}$, $SW_{B.3}$, $SW_{B.4}$ and 508 all may be open. The $\phi_1$ and $\phi_2$ signals may transition low on conclusion of the second phase P2.

In a third phase P3, the $\phi_1$, $\phi_2$ and $\phi_3$ signals are shown as low and the $\phi_4$ and $\phi_{SH}$ signals are shown as high. Thus, switches $SW_{A.4}$, $SW_{B.4}$ and 508 may be closed and switches $SW_{A.1}$-$SW_{A.3}$ and $SW_{B.1}$-$SW_{B.3}$ all may be open. Closure of the shorting switch 508 may cause charge sharing between first terminals of the sampling capacitors $C_{INA}$, $C_{INB}$, which may move the voltage at the first terminals to a common mode value ($V_{CM}$) of the input signals $V_{X+}$, $V_{X-}$. No current is drawn from the $V_{X+}$ and $V_{X-}$ inputs. Closure of the switches $SW_{A.4}$, $SW_{B.4}$ may connect output terminals of the capacitors $C_{INA}$, $C_{INB}$ to the integrating amplifier 506.

In a fourth phase P4, the $\phi_{SH}$ signal may transition low and the $\phi_3$ signal may transition high. The other control signals $\phi_1$, $\phi_2$ and $\phi_4$ may remain unchanged from phase P3. Thus, switches $SW_{A.3}$, $SW_{B.3}$, $SW_{A.4}$ and $SW_{B.4}$ may be closed and switches $SW_{A.1}$, $SW_{A.2}$, $SW_{B.1}$ and $SW_{B.2}$ and 508 all may be open. In phase P4, the input terminal of capacitor $C_{INA}$ may be connected to the $V_{X-}$ terminal by switch $SW_{A.3}$ and the input terminal of capacitor $C_{INB}$ may be connected to the $V_{X+}$ terminal by the switch $SW_{B.3}$. These connections may force a change in voltage to the outputs $V_{Y+}$, $V_{Y-}$ of the integrating amplifier 506 that corresponds to the difference between $V_{X+}$ and $V_{X-}$.

Operation of phases P1-P4 may repeat throughout operation of the integrator system 500. Thus, phase P5 is shown as a subsequent iteration of phase P1 and phase P0 is shown as a prior iteration of phase P4. Again, changes in the output voltage ($V_{Y+}-V_{Y-}$) may vary from iteration to iteration.

In an embodiment, the integrator 500 may include a controller 520 that generates the $\phi_1$, $\phi_2$, $\phi_3$, $\phi_4$ and $\phi_{SH}$ control signals in response to an input clock signal CLK that establishes timing reference for the integrator 500. The controller 520 may be a state machine that is driven by the input clock CLK. In an embodiment, the controller 520 may include a register (not shown) that defines a sampling period for the integrator 500 and, consequently, its sampling frequency. The register may allow the sampling frequency to be a dynamically programmable value.

In an embodiment, a falling transition of the $\phi_2$ signal may precede a falling transition of the $\phi_1$ signal in the P2 phase to mitigate against charge injection errors that otherwise might occur. Similarly, a falling transition of the $\phi_4$ signal may precede a falling transition of the $\phi_3$ signal in the P4 phase, again to mitigate against charge injection errors that otherwise might occur.

FIG. 6 illustrates an integrator system 600 and control signals according to another embodiment of the present invention. As illustrated in FIG. 6(a), the integrator system 600 may include a pair of sampling circuits 602, 604, an integrating amplifier 606 and a shorting switch 608. The integrator system 600 may accept a digital input signal that is represented within the integrator system 600 as a pair of input control signals $S_1$, $S_2$. The sampling circuits 602, 604, may sample respective components $V_{REF+}$, $V_{REF-}$ of a reference voltage $V_{REF}$ in an orientation set by the control signals $S_1$, $S_2$ (which may be derived from a sampled signal y(n)) to the integrating amplifier 606. The integrating amplifier 606, as its name implies, may integrate the sampled reference voltages $V_{REF+}$, $V_{REF-}$ under control of the $S_1$, $S_2$ control signals and may generate an output signal $V_Y$ therefrom.

The sampling circuits 602, 604 each may include a sampling capacitor, $C_{INA}$, $C_{INB}$ and a variety of switches $SW_{A.1}$-$SW_{A.4}$, $SW_{B.1}$-$SW_{B.4}$. A first terminal of each sampling capacitor $C_{INA}$, $C_{INB}$ (again, "input terminal") may be connected to reference voltages $V_{REF+}$ and $V_{REF-}$. Specifically, the input terminals of the sampling capacitors $C_{INA}$, $C_{INB}$ may be connected to the $V_{REF+}$ voltage source by respective switches $SW_{A.1}$, $SW_{B.3}$, which may be controlled by the first control signals $S_1$ ($SW_{A.1}$) and $S_2$ ($SW_{B.3}$) respectively. The input terminals of the sampling capacitors $C_{INA}$, $C_{INB}$ also may be connected to the $V_{REF-}$ voltage source by respective second switches $SW_{A.3}$, $SW_{B.1}$, which may be controlled by the second control signals $S_2$ ($SW_{A.3}$) and $S_1$ ($SW_{B.1}$) respectively. Second terminals of the sampling capacitors $C_{INA}$, $C_{INB}$ ("output terminal") may be connected to a reference voltage $V_S$ by respective third switches $SW_{A.2}$, $SW_{B.2}$, which may be controlled by a third control signal $\phi_2$. The output terminals of the sampling capacitors $C_{INA}$, $C_{INB}$ may be connected to the integrating amplifier 606 by respective fourth switches $SW_{A.4}$, $SW_{B.4}$, which may be controlled by a fourth control signal $\phi_4$.

A shorting switch 608 may connect the input terminals of the sampling capacitors $C_{INA}$, $C_{INB}$ to each other. The shorting switch 608 may be controlled by another control signal $\phi_{SH}$.

The integrating amplifier 606 may include a differential amplifier 610 and a pair of feedback capacitors $C_{FA}$, $C_{FB}$. The first feedback capacitor $C_{FA}$ may be coupled between a non-inverting input 612 and an inverting output 616 of the amplifier 610. The second feedback capacitor $C_{FB}$ may be coupled between an inverting input 614 and a non-inverting output 618 of the amplifier 610. The non-inverting input 612 may be connected to an output of sampling circuit 604 (switch $SW_{B.4}$) and the inverting input 614 may be connected to an output of sampling circuit 602 (switch $SW_{A.4}$).

As indicated, information content may be input to the integrator 600 by the $S_1$ and $S_2$ control signals that connect the sampling capacitors $C_{INA}$, $C_{INB}$ to the reference voltage sources $V_{REF+}$, $V_{REF-}$. Each $S_1$ and $S_2$ control signal may take one of the states of control signals $\phi_1$ or $\phi_3$ (FIG. 6(b)) based on the state of the input signal y(n). For convenience, it is useful to consider y(n) as having values 1 or −1. When y(n) has a value of 1, the $S_1$ control signal may be set to the $\phi_1$ state and the $S_2$ control signal may be set to the $\phi_3$ state. Alternatively, when y(n) has a value of 1, the $S_1$ control signal may be set to the $\phi_3$ state and the $S_2$ control signal may be set to the $\phi_1$ state.

FIG. 6(b) illustrates exemplary control signals that may be applied to the integrator system 600 according to an embodiment of the present invention. FIG. 6(b) illustrates an example where y(n)=1 and, therefore, $S_1=\phi_1$ and $S_2=\phi_3$. FIG. 6(b) illustrates four phases of operation P1-P4 that may repeat throughout operation of the integrator system 600. Two phases P2 and P4 may be operational phases during which the sampling circuits 602 and 604 may be connected to reference voltages $V_{REF+}$, $V_{REF-}$ to alternately sample voltages as determined by the control signals $S_1$, $S_2$ and drive the sampled voltages to the integrating amplifier 606. Two other phases P1 and P3 may be reset phases during which the input terminals of the sampling capacitors $C_{INA}$, $C_{in}$ may be set to voltages at intermediate levels between $V_{REF+}$ and $V_{REF-}$ based on charge redistribution. In this manner, the integrator system 600 may process an input signal y(n) and yet establishes independence between the current drain drawn from the reference inputs $V_{REF+}$ and $V_{REF-}$ and the input signal y(n).

In a first phase P1, the $S_1$, $S_2$, and $\phi_4$ signals are shown as low and the $\phi_2$ and $\phi_{SH}$ signals are shown as high. Thus, switches $SW_{A.2}$, $SW_{B.2}$ and 608 may be closed and switches $SW_{A.1}$, $SW_{A.3}$-$SW_{A.4}$ and $SW_{B.1}$, $SW_{B.3}$-$SW_{B.4}$ all may be open. Closure of the shorting switch 608 may cause charge sharing between first terminals of the sampling capacitors $C_{INA}$, $C_{INB}$, which may move the voltage at the input terminals to a common mode value ($V_{CM}$) of the input signals $V_{REF+}$, $V_{REF-}$, which was developed in a prior phase of operation (shown as P0). No current is drawn from the $V_{REF+}$ and $V_{REF-}$ sources. Closure of the switches $SW_{A.2}$, $SW_{B.2}$ may connect output terminals of the capacitors $C_{INA}$, $C_{INB}$ to the $V_S$ reference voltage. Thus, during phase P1, the capacitors each may sample a voltage of $V_{CM}-V_S$, where $V_{CM}=\frac{1}{2}(V_{REF+}+V_{REF-})$.

In a second phase P2, the $\phi_{SH}$ signal may transition low and the $S_1$ signal may transition high. The other control signals $S_2$, $\phi_2$ and $\phi_4$ may remain unchanged from phase P1. Thus, switches $SW_{A.1}$, $SW_{B.1}$ may connect input terminals of the sampling capacitors $C_{INA}$, $C_{INB}$ to $V_{REF+}$ and $V_{REF-}$, respectively. Switches $SW_{A.2}$ and $SW_{B.2}$ may remain closed. The sampling capacitor $C_{INA}$ may sample a voltage as $V_{REF+}-V_S$ and the sampling capacitor $C_{INB}$ may sample a voltage as $V_{REF-}-V_S$. Switches $SW_{A.3}$, $SW_{A.4}$, $SW_{B.3}$, $SW_{B.4}$ and 608 all may be open. The $S_1$ and $\phi_2$ signals may transition low on conclusion of the second phase P2.

In a third phase P3, the $S_1$, $S_2$ and $\phi_2$ signals are shown as low and the $\phi_4$ and $\phi_{SH}$ signals are shown as high. Thus, switches $SW_{A.34}$, $SW_{B.4}$ and 608 may be closed and switches $SW_{A.1}$-$SW_{A.3}$ and $SW_{B.1}$-$SW_{B.3}$ all may be open. Closure of the shorting switch 608 may cause charge sharing between first terminals of the sampling capacitors $C_{INA}$, $C_{INB}$, which may move the voltage at the first terminals to a common mode value ($V_{CM}$) of the input signals $V_{REF+}$, $V_{REF-}$. No current is drawn from the $V_{REF+}$ and $V_{REF-}$ sources. Closure of the switches $SW_{A.4}$, $SW_{B.4}$ may connect output terminals of the capacitors $C_{INA}$, $C_{INB}$ to the integrating amplifier 606.

In a fourth phase P4, the $\phi_{SH}$ signal may transition low and the $S_2$ signal may transition high. The other control signals $S_1$, $\phi_2$ and $\phi_4$ may remain unchanged from phase P3. Thus, switches $SW_{A.3}$, $SW_{B.3}$, $SW_{A.4}$ and $SW_{B.4}$ may be closed and switches $SW_{A.1}$, $SW_{A.2}$, $SW_{B.1}$ and $SW_{B.2}$ and 608 all may be open. In phase P4, the input terminal of capacitor $C_{INA}$ may be connected to the $V_{REF-}$ terminal by switch $SW_{A.3}$ and the input terminal of capacitor $C_{INB}$ may be connected to the $V_{REF+}$ terminal by the switch $SW_{B.3}$. These connections may force a change in voltage to the outputs $V_{Y+}$, $V_{Y-}$ of the integrating amplifier 606 that corresponds to the difference between $V_{REF+}$ and $V_{REF-}$. In addition the direction of change in voltage may depend on phasing of the control signals $S_1$, $S_2$, which may be derived from y(n).

As noted, the discussion above relates to a circumstance in which y(n)=1. If y(n)=1, then the $S_1$ signal would have taken the form of the $\phi_3$ signal and transitioned high in phase P3. Similarly, the $S_2$ signal would have taken the form of the $\phi_1$ signal and transitioned high in phase P1. Thus, the $S_1$, $S_2$ signals are modulated with information content from the y(n) input signal.

Operation of phases P1-P4 may repeat throughout operation of the integrator system 600. Thus, phase P5 is shown as a subsequent iteration of phase P1 and phase P0 is shown as a prior iteration of phase P4. Again, the change in the output voltage ($V_{y+}-V_{y-}$) may vary from iteration to iteration. Of course, the control signals $S_1$, $S_2$ may vary in subsequent iterations based on new values of y(n) and, therefore, operation need not repeat from iteration to iteration.

As in the prior embodiments, falling transitions of the $\phi_2$ and $\phi_4$ signals may precede falling transitions of the $S_1$, $S_2$ signals in the P2 and P4 phases to mitigate against charge injection errors that otherwise might occur.

In an embodiment, the integrator system 600 may include a controller 620 that generates the $S_1$, $S_2$, $\phi_2$, $\phi_4$ and $\phi_{SH}$ control signals in response to the input signal y(n) and an input clock signal that establishes a timing reference for the integrator system 600. The controller 620 may be a state machine that generates $S_1$, $S_2$, $\phi_2$, $\phi_4$ and $\phi_{SH}$ control signals at times illustrated in FIG. 6(b). Additionally, the controller 620 may include logic circuits (not shown) to logically combine the y(n), $\phi_1$ and $\phi_3$ signals to generate the $S_1$, $S_2$ control signals. In an embodiment, the controller 620 may include a register (not shown) that defines a sampling period for the integrator system 600 (and, consequently, its sampling frequency). The register may allow the sampling frequency to be a dynamically programmable value.

As indicated, input terminals of the sampling capacitors $C_{INA}$, $C_{INB}$ in the sampling circuits 602, 604 may be shorted between each operational phase change (between phases P2 and P4). The input terminals of the sampling capacitors $C_{INA}$, $C_{INB}$, therefore, may charge to a level of the $V_{REF+}$ and $V_{REF-}$, specifically their common mode value. In an embodiment, when $C_{FA}=C_{FB}=C_F$, $C_{INA}=C_{INB}=C_{IN}$, the average current drawn from nodes $V_{REF+}$ and $V_{REF-}$ may be expressed as:

$$\overline{I_{V_{ref+}}} = -\overline{I_{V_{ref-}}} = V_{ref} f_s C_{in}. \qquad \text{Eq. 4}$$

As seen by Eq. 4, the average drawn current may be independent of the signal content $S_1$, $S_2$ (y(n)). The average current may depend on reference voltage, sampling frequency, and aggregate size of the capacitors, but the average current may be substantially decoupled from the y(n) state dependence. By contrast, Eq. 2 demonstrates that current draw depends on signal content, which is reflected in use of the $V_{REF}$, y(n) and $V_{IN}$ terms respectively. By shorting the left plates of the input (sampling) capacitors, the charge transferred may not depend on the previous state of the circuit as in conventional systems.

Figure 7:
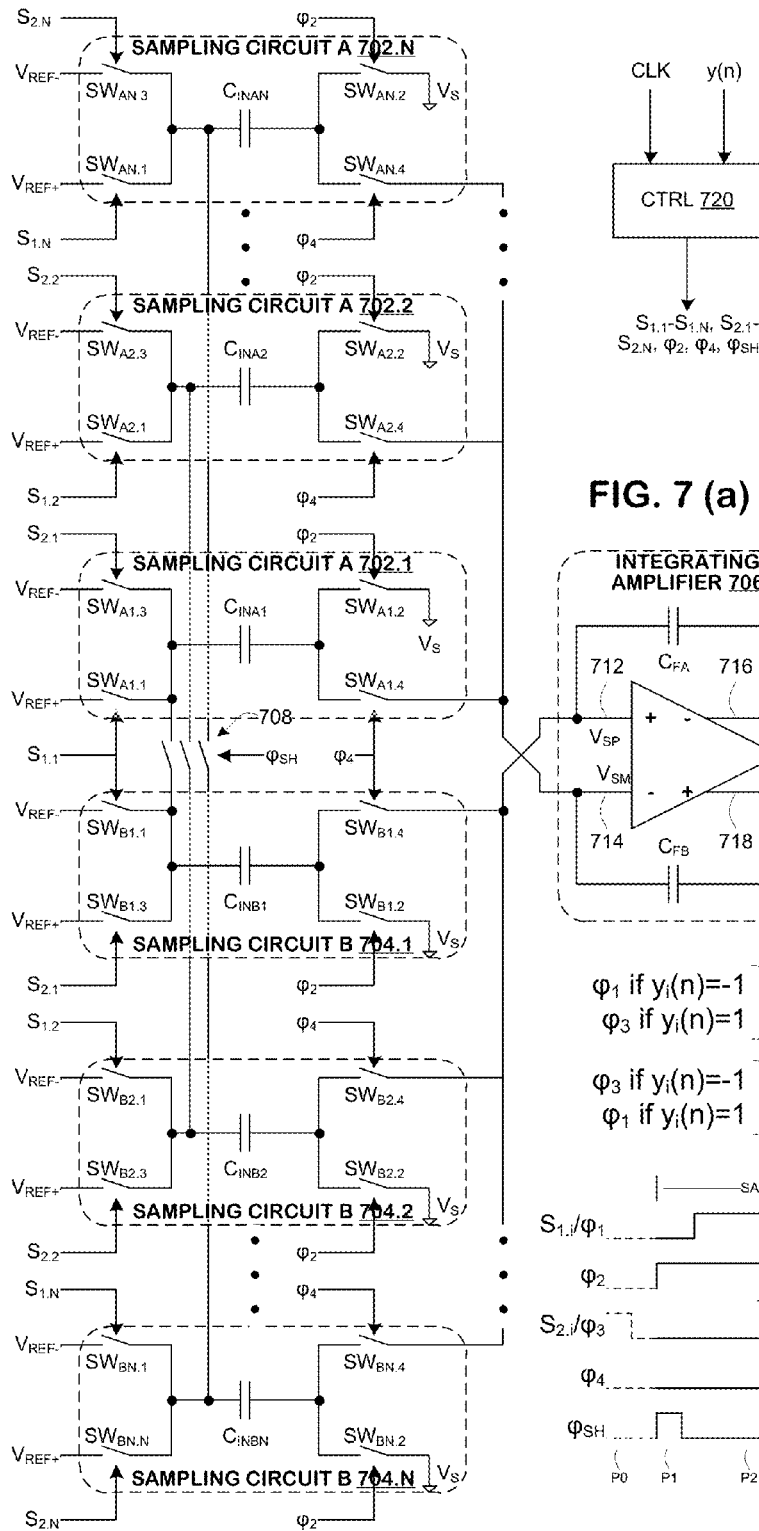
FIGS. 7(a) and 7(b) illustrate an integrator system and control signals according to another embodiment of the present invention.
Figure 7:
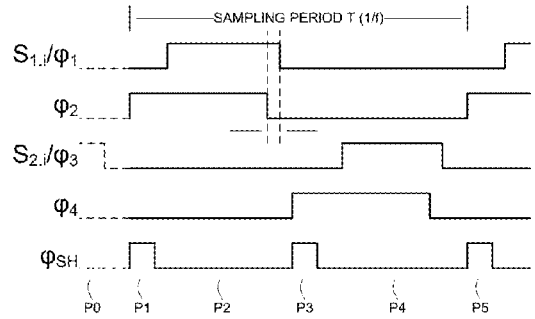

FIG. 7 illustrates an integrator system 700 and control signals according to another embodiment of the present invention. As illustrated in FIG. 7(a), the integrator system 700 may be a multi-bit system that includes a plurality of sampling circuits 702.1-702.N, 704.1-704.N, an integrating amplifier 706 and a variety of shorting switches 708 (individual switches not labeled). The integrator system 700 may include a first sampling circuit 702.i and a second sampling circuit 704.i for each quantization level i of an input signal y(n). Thus, if the input signal y(n) has N quantization levels, there may be N first sampling circuits 702.1-702.N and N second sampling circuits 704.1-704.N provided in a paired relationship. Each sampling circuit 702.i, 704.i may sample respective components $V_{REF+}$, $V_{REF-}$ of the input signal $V_{REF}$ having an orientation set by the control signal $S_{1,i}$, $S_{2,i}$ corresponding to quantization level i of an input signal $y_i(n)$ and may output the sampled signal to the integrating amplifier 706 which are merged with outputs from the other sampling circuits. The integrating amplifier 706, as its name implies, may integrate the merger of the sampled signals and generate an output signal $V_Y$ therefrom.

The first and second sampling circuits 702.1-702.N, 704.1-704.N may be constructed as in the embodiment of FIG. 6. For example, sampling circuits 702.1 and 704.1 each may include a respective sampling capacitor, $C_{INA1}$, $C_{INB1}$ and a variety of switches $SW_{A1.1}$-$SW_{A1.4}$, $SW_{B1.1}$-$SW_{B1.4}$. An input terminal of each sampling capacitor $C_{INA1}$, $C_{INB1}$ may be connected to reference voltages $V_{REF+}$ and $V_{REF-}$. Specifically, the input terminals of the sampling capacitors $C_{INA1}$, $C_{INB1}$ may be connected to the $V_{REF+}$ voltage source by respective switches $SW_{A1.1}$, $SW_{B1.3}$, which may be controlled respectively by control signals $S_{1,1}$ and $S_{2,1}$. The input terminals of the sampling capacitors $C_{INA1}$, $C_{INB1}$ also may be connected to the $V_{REF-}$ voltage source by respective second switches $SW_{A1.3}$, $SW_{B1.1}$, which may be controlled respectively by control signal $S_{1,1}$ and $S_{2,1}$. Output terminals of the sampling capacitors $C_{INA1}$, $C_{INB1}$ may be connected to a reference voltage $V_S$ by respective third switches $SW_{A1.2}$, $SW_{B1.2}$, which may be controlled by another control signal $\phi_2$. The output terminals of the sampling capacitors $C_{INA1}$, $C_{INB1}$ may be connected to the integrating amplifier 706 by respective fourth switches $SW_{A1.4}$, $SW_{B1.4}$, which may be controlled by a further control signal $\phi_4$.

The first and second sampling circuits 702.2-702.N, 704.2-704.N of the other quantization level positions may be constructed similarly. That is, the sampling circuits 702.i and 704.i at each position i may include a respective sampling capacitor, $C_{INAi}$, $C_{INBi}$ and a variety of switches $SW_{Ai.1}$-$SW_{Ai.4}$, $SW_{Bi.1}$-$SW_{Bi.4}$. The switches $SW_{Ai.1}$-$SW_{Ai.4}$, $SW_{Bi.1}$-$SW_{Bi.4}$ may be controlled by respective switch control signals $S_{1,i}$, $S_{2,i}$, $\phi_2$ and $\phi_4$. The $\phi_2$ and $\phi_4$ control signals may be input to the output switches of each sampling circuit A and B in common.

The integrator system 700 may include a plurality of shorting switches 708, one provided for each position i. The shorting switches 708 may connect the input terminals of the sampling capacitors $C_{INAi}$, $C_{INBi}$ of each position to each other. All shorting switches 708 may be controlled by a common control signal $\phi_{SH}$.

The integrating amplifier 706 may include a differential amplifier 710 and a pair of feedback capacitors $C_{FA}$, $C_{FB}$. The first feedback capacitor $C_{FA}$ may be coupled between a non-inverting input 712 and an inverting output 716 of the amplifier 710. The second feedback capacitor $C_{FB}$ may be coupled between an inverting input 714 and a non-inverting output 718 of the amplifier 710. The non-inverting input 712 may be connected to outputs of the sampling circuits 704.1-704.N in common and the inverting input 714 may be connected to outputs of the sampling circuits 702.1-702.N in common.

As indicated, information content may be input to the integrator 700 by the $S_{1,i}$ and $S_{2,i}$ control signals that connect the sampling capacitors $C_{INAi}$, $C_{INBi}$ to the reference voltage sources $V_{REF+}$, $V_{REF-}$. Each $S_{1,i}$ and $S_{2,i}$ control signal may take one of the states of $\phi_1$ or $\phi_3$ based on the state of an input $y_i(n)$ derived from the input signal y(n). When $y_i(n)$ has a value of 1, the $S_{1,i}$ control signal may be set to the $\phi_1$ state and the $S_{2,i}$ control signal may be set to the $\phi_3$ state. Alternatively, when $y_i(n)$ has a value of 1, the $S_{1,i}$ control signal may be set to the $\phi_3$ state and the $S_{2,i}$ control signal may be set to the $\phi_1$ state.

In another embodiment (not illustrated), the switches $SW_{A1.2}$-$SW_{AN.2}$, $SW_{A1.4}$-$SW_{AN.4}$, $SW_{B1.2}$-$SW_{BN.2}$, $SW_{B1.4}$-$SW_{BN.4}$, may be combined into single switches. In such an embodiment, the output terminals of the capacitors $C_{INA1}$-$C_{INAN}$ from the sampling circuits 702.1-702-N may be coupled together at a common output node. A single switch (not shown) may couple the output node of the capacitors $C_{INA1}$-$C_{INAN}$ to the reference voltage $V_S$ in lieu of switches $SW_{A1.2}$-$SW_{AN.2}$ and may be controlled by the $\phi_2$ signal. A second switch (also not shown) may couple the output terminals of the capacitors $C_{INA1}$-$C_{INAN}$ to the integrating amplifier 706 in lieu of switches $SW_{A1.4}$-$SW_{AN.4}$ and may be controlled by the $\phi_4$ signal. Similarly, the output terminals of the capacitors $C_{INB1}$-$C_{INBN}$ from the sampling circuits 704.1-704.N may be coupled together at a common output node. A single switch (not shown) may couple the output node of the capacitors $C_{INB1}$-$C_{INBN}$ to the reference voltage $V_S$ in lieu of switches $SW_{B1.2}$-$SW_{BN.2}$ and may be controlled by the $\phi_2$ signal. A second switch (also not shown) may couple the output terminals of the capacitors $C_{INB1}$-$C_{INBN}$ to the integrating amplifier 706 in lieu of switches $SW_{B1.4}$-$SW_{BN.4}$ and may be controlled by the $\phi_4$ signal.

FIG. 7(b) illustrates exemplary control signals that may be applied to the integrator system 700 for an pair of sampling circuit 702.i, 704.i, according to an embodiment of the present invention. FIG. 7(b) illustrates an example where $y_i(n)=1$ and, therefore, $S_{1,i}=\phi_1$ and $S_{2,i}=\phi_3$. FIG. 7(b) illustrates four phases of operation P1-P4 that may repeat throughout operation of the integrator system 700. Two phases P2 and P4 may be operational phases during which the sampling circuits 702.i and 704.i may be driven according to the input $y_i(n)$ to alternately sample the reference signal and drive it to the integrating amplifier 706. The sampling circuits of other positions also may sample the reference signal and drive it to the integrating amplifier 706 based on the other quantization levels of the input signal y(n). Two other phases P1 and P3 may be reset phases during which voltages at the inputs of all sampling circuits 702.1-702.N, 704.1-704.N may be set to known states. In this manner, the integrator system 700 may process the input signal y(n) and yet establishes independence between the current drain drawn from the reference inputs and the input signal y(n).

Operation of sampling stages 702.*i* and 704.*i* may proceed as discussed above with respect to FIG. 6.

Operation of phases P1-P4 may repeat throughout operation of the integrator system 700. Thus, phase P5 is shown as subsequent iteration of phase P1 and phase P0 is shown as a prior iteration of phase P4. Of course, the control signals $S_{1,i}$, $S_{2,i}$ may vary in subsequent iterations based on new values of y(n) and, therefore, operation need not repeat from iteration to iteration.

In an embodiment, the integrator system 700 may include a controller 720 that generates the $S_{1.1}$-$S_{1.N}$, $S_{2.1}$-$S_{2.N}$, $\phi_2$, $\phi_4$ and $\phi_{SH}$, control signals in response to the input signal y(n) and an input clock signal that establishes a timing reference for the integrator system 700. The controller 720 may be a state machine that generates $S_{1.1}$-$S_{1.N}$ $S_{2.1}$-$S_{2.N}$, $\phi_2$, $\phi_4$ and $\phi_{SH}$ control signals at times illustrated in FIG. 7(*b*). Additionally, the controller 720 may include logic circuits (not shown) to logically combine each $y_i$(n) input with the $\phi_1$ and $\phi_3$ signals to generate the $S_{1,i}$ and $S_{2,i}$ control signals. In an embodiment, the controller 720 may include a register (not shown) that defines a sampling period for the integrator 700 and, consequently, its sampling frequency. The register may allow the sampling frequency to be a dynamically programmable value.

As indicated, input terminals of the sampling capacitors $C_{INA1}$-$C_{INAN}$, $C_{INB1}$-$C_{INBN}$ in the sampling circuits 702.1-702.N, 704.1-704.N may be shorted between each operational phase change (between phases P2 and P4). The input terminals of the sampling capacitors $C_{INA1}$-$C_{INAN}$, $C_{INB1}$-$C_{INBN}$, therefore, may charge to a level intermediate of $V_{REF+}$ and $V_{REF-}$, specifically their common mode value. In an embodiment, when $C_{FA}=C_{FB}=C_F$ and $C_{INAi}=C_{INBi}=C_{IN}$ (for all i), the average current drawn from nodes $V_{REF+}$ and $V_{REF-}$ may be expressed as:

$$\overline{I_{V_{ref+}}} = -\overline{I_{V_{ref-}}} = N^* V_{ref} f_s C_{in}. \qquad \text{Eq. 5}$$

As seen by Eq. 5, the average drawn current may depend on the number N of stages but is independent of the signal content $S_{1,i}$, $S_{2,i}$ (y(n)). The average current may depend on reference voltage, sampling frequency, and aggregate size of the capacitors, but the average current may be substantially decoupled from the y(n) state dependence. By contrast, Eq. 2 demonstrates that current draw depends on signal content, which is reflected in use of the y(n) term.

Figure 8:
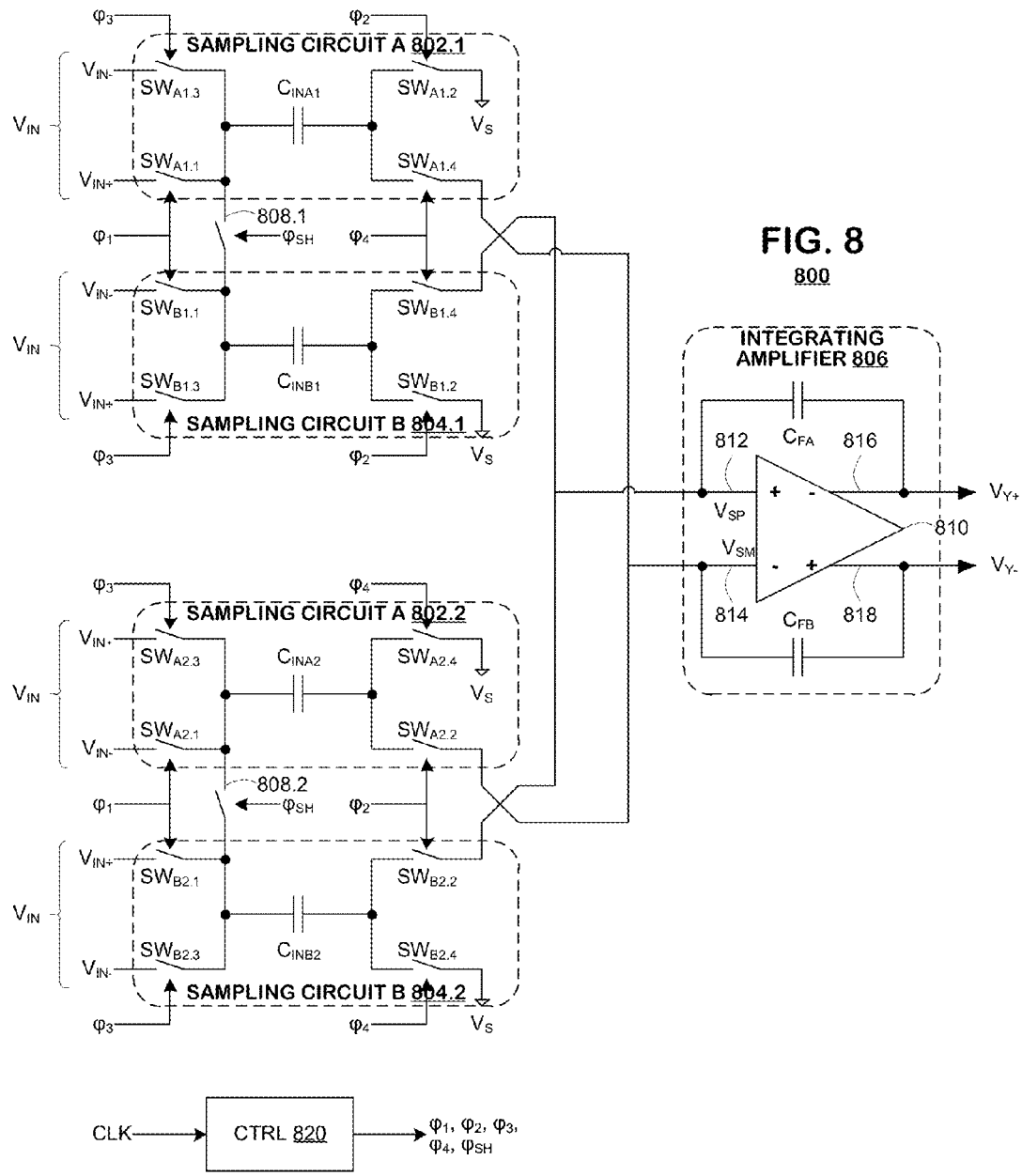
FIG. 8 illustrates an integrator system according to a further embodiment of the present invention.

FIG. 8 is a diagram of an integrator system 800 according to another embodiment of the present invention. The integrator system 800 of FIG. 8 may include two pairs of complementary sampling circuits 802.1, 802.2, 804.1 and 804.2, an integrating amplifier 806 and shorting switches 808.1, 808.2. The integrator system 800 may accept an input signal $V_{IN}$ that is represented within the integrator system 800 as a pair of differential inputs $V_{IN+}$, $V_{IN-}$ that vary differentially with respect to each other.

The first pair of sampling circuits 802.1, 804.1 each may include a respective sampling capacitor, $C_{INA1}$, $C_{INB1}$ and a variety of switches $SW_{A1.1}$-$SW_{A1.4}$, $SW_{B1.1}$-$SW_{B1.4}$. A first terminal of each sampling capacitor $C_{INA1}$, $C_{INB1}$ (called, "input terminals" for convenience) may be connected to the $V_{IN+}$ terminals by respective switches $SW_{A1.1}$-$SW_{B1.3}$. The input terminal of each sampling capacitor $C_{INA1}$, $C_{INB1}$ also may be connected to the $V_{IN-}$ terminals by respective second switches $SW_{A1.3}$, $SW_{B1.1}$. A second terminal of each sampling capacitor $C_{INA1}$, $C_{INB1}$ (called "output terminals," for convenience) may be connected to a reference voltage $V_S$ by respective third switches $SW_{A1.2}$, $SW_{B1.2}$. The output terminal of each sampling capacitor $C_{INA1}$, $C_{INB1}$ may be connected to the integrating amplifier 806 by respective fourth switches $SW_{A1.3}$, $SW_{B1.4}$. The switches $SW_{A1.1}$, $SW_{B1.1}$ may be controlled by a first control signal $\phi_1$. The switches $SW_{A1.2}$, $SW_{B1.2}$ may be controlled by a second control signal $\phi_2$. The switches $SW_{A1.3}$, $SW_{B1.3}$ may be controlled by a third control signal $\phi_3$. The switches $SW_{A1.4}$, $SW_{B1.4}$ may be controlled by a fourth control signal $\phi_4$.

The second pair of sampling circuits 802.2, 804.2 may have an architecture that operates in anti-phase to that of the first pair of sampling circuits 802.1, 804.1. The second pair of sampling circuits 802.2, 804.2 also may include respective sampling capacitors $C_{INA2}$, $C_{INB2}$ and a variety of switches $SW_{A2.1}$-$SW_{A2.4}$, $SW_{B2.1}$-$SW_{B2.4}$. An input terminal of each sampling capacitor $C_{INA2}$, $C_{INB2}$ may be connected to the $V_{IN+}$ terminals by respective switches $SW_{A2.3}$, $SW_{B2.1}$. The input terminal of each sampling capacitors $C_{INA2}$, $C_{INB2}$ also may be connected to the $V_{IN-}$ terminals by respective second switches $SW_{A2.1}$, $SW_{B2.3}$. An output terminal of each sampling capacitor $C_{INA2}$, $C_{INB2}$ may be connected to the $V_S$ reference voltage by respective third switches $SW_{A2.4}$, $SW_{B2.4}$. The output terminal of each sampling capacitor $C_{INA2}$, $C_{INB2}$ may be connected to the integrating amplifier 806 by respective fourth switches $SW_{A2.2}$, $SW_{B2.2}$. The switches $SW_{A2.1}$, $SW_{B2.1}$ may be controlled by a control signal $\phi_1$. The switches $SW_{A2.2}$, $SW_{B2.2}$ may be controlled by a control signal $\phi_2$. The switches $SW_{A2.3}$, $SW_{B2.3}$ may be controlled by a control signal $\phi_3$. The switches $SW_{A2.4}$, $SW_{B2.4}$ may be controlled by a control signal $\phi_4$. Control of the switches $SW_{A1.4}$, $SW_{B1.4}$ and $SW_{A2.2}$, $SW_{B2.2}$ between the first pair of sampling circuits 802.1, 804.2 and the second pair of sampling circuits 802.2, 802.4 may cause the sampling circuits to operate in anti-phase with respect to each other. That is, a first pair of sampling circuits 802.1, 804.2 may sample the input voltage $V_{IN+}$, $V_{IN-}$ while the second pair of sampling circuits 802.2, 802.4 output previously-sampled input voltages to the integrating amplifier 806.

Shorting switches 808.1, 808.2 may connect the input terminals of each pair of sampling capacitors $C_{INA1}$, $C_{INB1}$ and $C_{INA2}$, $C_{INB2}$ to each other. The shorting switches 808.1, 808.2 may be controlled by a common control signal $\phi_{SH}$.

The integrating amplifier 806 may include a differential amplifier 810 and a pair of feedback capacitors $C_{FA}$, $C_{FB}$. The first feedback capacitor $C_{FA}$ may be coupled between a non-inverting input 812 and an inverting output 816 of the amplifier 810. The second feedback capacitor $C_{FB}$ may be coupled between an inverting input 814 and a non-inverting output 818 of the amplifier 810. The non-inverting input 812 may be connected to an output of sampling circuits 804.1, 804.2 (switches $SW_{B1.4}$, $SW_{B2.2}$) and the inverting input 814 may be connected to an output of sampling circuits 802.1, 802.2 (switches $SW_{A1.4}$, $SW_{A2.2}$).

In an embodiment, control of the integrator system 800 may proceed as illustrated in FIG. 3(*b*). Again, the phases P2 and P4 may be operational phases during which the pairs of sampling circuits 802.1, 804.1 and 802.2, 804.2 may alternately sample the input signal and drive the input signal to the integrating amplifier 306. Specifically, the first pair of sampling circuits 802.1, 804.1 may sample the input voltage during phase P2 and drive the sampled voltage during phase P4. The second pair of sampling circuits 802.2, 804.2 may sample the input voltage during phase P4 and drive the sampled voltage during phase P2. The other two phases P1 and P3 may be reset phases during which input terminals of the input capacitors $C_{INA}$, $C_{INB}$ may be set to voltages at intermediate levels between $V_{IN+}$ and $V_{IN-}$ without drawing current from circuit inputs, such as $V_{IN+}$, $V_{IN-}$.

Figure 9:
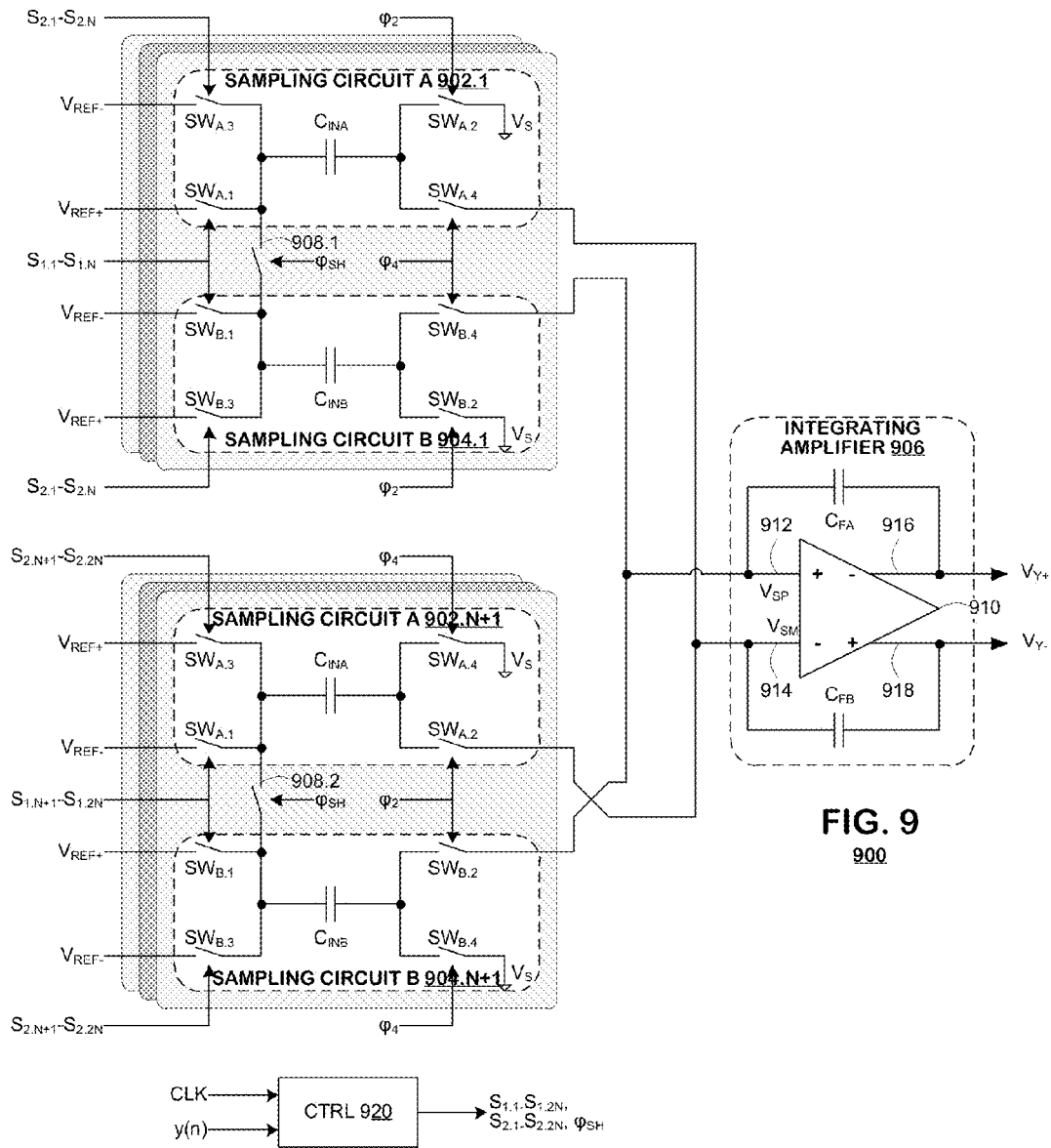
FIG. 9 illustrates an integrator system according to another embodiment of the present invention.

FIG. 9 is a diagram of a multi-bit integrator system 900 according to another embodiment of the present invention. The integrator system 900 may include a plurality of sampling circuits 902.1-902.2N, 904.1-904.2N, an integrating amplifier 906 and a variety of shorting switches 908 (individual switches not labeled). In this system, if an input signal y(n) has N quantization levels, there may be 2N first sampling circuits 902.1-902.2N and 2N second sampling circuits 904.1-904.N provided in a paired relationship and grouped into two sets of N sampling circuit pairs. A first set of sampling circuit pairs 902.1-902.N, 904.1-902.N may sample an input signal during a first operational phase (say, phase P2) and may output the sampled signal during a second operational phase (P4), while the second set of sampling circuit pairs 902.N+1-902.2N, 904.N+1-902.2N may sample an input signal during the second operational phase (P4) and may output the sampled signal during the first operational phase (P2).

The sampling circuits 902.1-902.2N, 904.1-904.N may have a construction as in the FIG. 7 embodiment. Control signals $S_{1.1}$-$S_{1.N}$, $S_{2.1}$-$S_{2.N}$ to the input switches of first set of sampling circuit pairs 902.1-902.N, 904.1-904.N may operate with a half-cycle phase offset as compared to the control signals $S_{1.N+1}$-$S_{1.2N}$, $S_{2.N+1}$-$S_{2.2N}$ of the input switches for the second set of sampling circuit pairs 902.N+1-902.2N, 904.N+1-904.2N, as discussed in connection with the FIG. 7 embodiment.

The shorting switches 908 may connect the input terminals of the paired sampling capacitors among the sampling circuits 902.1-902.2N, 904.1-904.2N to each other. The shorting switches 908.1, 908.2 may be controlled by a common control signal $\phi_{SH}$, which may close during P1 and P3 phases as discussed in the prior embodiments.

The integrating amplifier 906 may include a differential amplifier 910 and a pair of feedback capacitors $C_{FA}$, $C_{FB}$. The first feedback capacitor $C_{FA}$ may be coupled between a non-inverting input 912 and an inverting output 916 of the amplifier 910. The second feedback capacitor $C_{FB}$ may be coupled between an inverting input 914 and a non-inverting output 918 of the amplifier 910. The non-inverting input 912 may be connected to an output of sampling circuit 904 and the inverting input 914 may be connected to an output of sampling circuit 902.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. An integrator system, comprising:
    an integrator having a pair of inputs,
    a pair of sampling circuits, each having a sampling capacitor, to sample respective components of a differential input signal on the sampling capacitor in a first phase of operation and to drive a representation of the sampled input signal to the integrator inputs in a second phase of operation, and
    a shorting switch to connect input terminals of the sampling capacitors together during third and fourth phases of operation that occur between successions of the first phase and the second phase, wherein the differential input signal is decoupled from the sampling capacitors during the third and fourth phases.

2. The integrator system of claim 1, wherein each sampling circuit comprises:
    a first switch coupling the input terminal of the sampling capacitor to a terminal for a first differential component of the input signal,
    a second switch coupling the input terminal of the sampling capacitor to a terminal for a second differential component of the input signal, complementary to the first differential component,
    a third switch coupling an output terminal of the sampling capacitor to a reference voltage, and
    a fourth switch coupling the output terminal of the sampling capacitor to the integrator.

3. The integrator system of claim 1, wherein each sampling circuit comprises:
    a first switch coupling the input terminal of the sampling capacitor to a terminal for a first reference voltage,
    a second switch coupling the input terminal of the sampling capacitor to a terminal for a second reference voltage having a different voltage level than the first reference voltage,
    a third switch coupling an output terminal of the sampling capacitor to a third reference voltage, and
    a fourth switch coupling the output terminal of the sampling capacitor to the integrator.

4. The integrator system of claim 3, wherein the first and second switches of the sampling circuit are controlled by a binary control signal during the first and second phases.

5. The integrator system of claim 1, further comprising:
    a second pair of sampling circuits, each having a sampling capacitor, to sample respective components of a differential input signal on the sampling capacitor in the second phase of operation and to drive the sampled input signal to the integrator inputs in the first phase of operation, and
    a second shorting switch to connect together input terminals of the capacitors of the second pair of sampling circuits during the third phase of operation.

6. A method of sampling a differential input signal, comprising, iteratively:
    in a first phase of operation, sampling differential components of the input signal on respective capacitors,
    in a second phase of operation, decoupling the input signal from the capacitors and shorting input terminals of the capacitors together by connecting the input terminals of the capacitors together,
    in a third phase of operation, driving the sampled input signal to an output circuit using a differential voltage source, and
    in a fourth phase of operation, decoupling the input signal from the capacitors and shorting the input terminals of the capacitors together by connecting the input terminals of the capacitors together.

7. The method of claim 6, further comprising a first pair of switches, each coupling an input terminal of a respective capacitor to a respective component of the input signal.

8. The method of claim 6, further comprising a first pair of switches, each coupling an input terminal of a respective capacitor to a respective reference voltage and controlled by the input signal.

9. The method of claim 6, further comprising
    in the first phase of operation, driving differential components of a previously-sampled input signal from a second pair of capacitors,
    in the second phase of operation, shorting input terminals of the second pair of capacitors together, and in the third phase of operation, sampling differential components of another portion of the input signal on the second pair of capacitors, and in the fourth phase of operation, shorting the input terminals of the capacitors together.

10. A system, comprising:
a pair of capacitors,
a control circuit to couple input terminals of the capacitors to respective components of an input signal,
a charge redistribution circuit to perform charge redistribution between the input terminals of the capacitors to move the voltage at the input terminals to a common mode value of the input signal, and
an output circuit to connect output terminals of the capacitors to a next circuit stage in an output configuration.

11. The system of claim 10, wherein the charge redistribution circuit comprises a switch coupled between the input terminals of the capacitors.

12. The system of claim 11, wherein the switch couples together the input terminals of the capacitors when the control circuit decouples the capacitors from the respective components of the input signal.

13. A multi-bit integrator system, comprising:
a differential integrator having a pair of inputs;
a plurality of pairs of sampling circuits, each having:
  a sampling capacitor, and
  a pair of input switches, each connecting an input terminal of the sampling capacitor to a respective one of a pair of differential reference voltages, wherein switch control signals of the input switches carry digital information to be sampled by the integrator system;
a pair of first output switches, one of the first output switches connecting output terminals of the sampling capacitors from a first one of the pairs of sampling circuits to a third reference voltage, the other of the first output switches connecting output terminals of the sampling capacitors from a second one of the pairs of sampling circuits to the third reference voltage;
a pair of second output switches, one of the second output switches connecting output terminals of the sampling capacitors from the first one of the pairs of sampling circuits to a first input of the differential integrator, the other of the second output switches connecting output terminals of the sampling capacitors from the second one of the pairs of sampling circuits to a second input of the differential integrator; and
a plurality of shorting switches, each directly connected between input terminals of the sampling capacitors from a respective pair of sampling circuits.

14. A sigma delta modulator, comprising:
a differential integrator having a pair of inputs;
a sampling system having input terminals for a differential input voltage; the sampling system having a pair of sampling circuits, each having a sampling capacitor, to sample respective components of the differential input voltage on the sampling capacitor in a first phase of operation and to drive the sampled input signal respectively to the integrator inputs in a second phase of operation;
a shorting switch to connect input terminals of the sampling capacitors together during a third phase of operation between the first phase and the second phase when the input terminals of the sampling capacitors are decoupled from the differential input voltage;
an analog-to-digital converter (ADC) having input terminals in communication with output terminals of the sampling system; and a digital to analog converter (DAC) provided in a feedback path of the modulator, having an input coupled to an output of the ADC.

15. The modulator of claim 14, wherein the differential integrator system is provided in the sampling system and each sampling circuit comprises:
a first switch coupling the input terminal of the sampling capacitor to a terminal for a first differential component of the input signal,
a second switch coupling the input terminal of the sampling capacitor to a terminal for a second differential component of the input signal, complementary to the first differential component,
a third switch coupling an output terminal of the sampling capacitor to a reference voltage, and
a fourth switch coupling the output terminal of the sampling capacitor to the integrator.

16. A method of integrating a differential input signal, comprising, iteratively:
in a first phase of operation, sampling differential components of the input signal on a pair of capacitors,
in a second phase of operation, redistributing charge between input terminals of the pair of capacitors by directly connecting the input terminals of the pair of capacitors together,
in a third phase of operation, driving the sampled input signal from the capacitors to an integration amplifier, and
in a fourth phase of operation, redistributing charge between input terminals of the pair of capacitors by directly connecting the input terminals of the pair of capacitors together.

17. The method of claim 16, wherein, during the second and fourth phases of operation, the charge redistribution occurs without supply of current from a source of the input signal.

18. The method of claim 16, wherein, during the second and fourth phases of operation, the charge redistribution occurs without supply of current from any power supply of a system in which the method is performed.

19. A method, comprising:
in a first phase of operation, coupling input terminals of first and second capacitors to respective components of an input voltage;
in a second phase of operation, decoupling the input terminals of the first and second capacitors from the input voltage and performing charge sharing between the input terminals of the first and second capacitors to move the voltage at the input terminals to a common mode value of the input voltage.

20. The method of claim 19, wherein performing charge sharing further comprises coupling input terminals of the first and second capacitors together.

21. The method of claim 20, wherein coupling input terminals of the first and second capacitors together further comprises directly connecting the input terminals of the first and second capacitors.

22. A system, comprising:
a first circuit, comprising a first capacitor;
a second circuit, comprising a second capacitor, wherein the first and second capacitors are alternatively coupled to first and second components of an input signal of the system; and
a switch coupling input terminals of the first and second capacitors together for charge sharing when the first and second capacitors are decoupled from the input signal of the system to move the voltage at the input terminals to a common mode value of the input signal.

23. The system of claim 22, wherein the switch directly connects together the input terminal of the first capacitor and the input terminal of the second capacitor.

24. The system of claim 22, wherein the first and second capacitors are respectively coupled to first and second components of the input signal during a first phase of operation.

25. The system of claim 24, wherein the first and second capacitors are respectively coupled to the second and first components of the input signal during a second phase of operation.

26. The system of claim 25, wherein the input terminals of the first and second capacitors are coupled together by the switch during third and fourth phases of operation that occur between successions of the first phase and the second phase.

* * * * *